United States Patent [19]
Laughlin

[11] Patent Number: 5,170,104
[45] Date of Patent: Dec. 8, 1992

[54] LINEAR ACTUATOR CONTROL SYSTEM FOR PLATFORM STABILIZATION

[75] Inventor: Darren Laughlin, Albuquerque, N. Mex.

[73] Assignee: Applied Technology Corporation, Albuquerque, N. Mex.

[21] Appl. No.: 747,674

[22] Filed: Aug. 20, 1991

[51] Int. Cl.$^5$ .................. H02K 5/24; H02K 33/18
[52] U.S. Cl. ................................ 318/135; 310/13; 310/51; 384/118
[58] Field of Search ............ 310/12, 13, 15, 51, 310/90; 318/135, 128, 649; 384/12, 118; 33/DIG. 1; 73/516 R, 517 R, 663

[56] References Cited

U.S. PATENT DOCUMENTS

| | | | |
|---|---|---|---|
| 3,155,438 | 11/1964 | Ruegg | 384/18 |
| 3,743,870 | 7/1973 | Hunt | 310/13 |
| 3,766,787 | 10/1973 | Irvine | 73/516 R |
| 4,260,914 | 4/1981 | Hertrich | 310/15 |
| 4,792,707 | 12/1988 | Katanuma | 310/12 |
| 4,897,582 | 1/1990 | Otten et al. | 318/135 |
| 4,929,874 | 5/1990 | Mizuno et al. | 310/51 |
| 5,016,238 | 5/1991 | Shtipelman et al. | 318/135 |

Primary Examiner—Steven L. Stephan
Assistant Examiner—D. S. Rebsch
Attorney, Agent, or Firm—Pollock, Vande Sande & Priddy

[57] ABSTRACT

An inertial linear actuator for stabilizing a platform against vibration includes a movable coil having windings which may be energized, supported on an actuator guide for movement. The actuator guide is fixed to the platform and a current is supplied to the movable coil to generate a force for damping sensed vibrations on the platform surface. Permanent magnets parallel to the actuator guide, and a current in the movable coil results in a force being introduced between the movable coil and the stationary actuator guides. A control system on the platform supplies a feedback signal from an accelerometer coupled to the platform to drive electronics. The drive electronics produce a current having the magnitude and direction for creating the actuator force for damping the sensed disturbance.

15 Claims, 7 Drawing Sheets

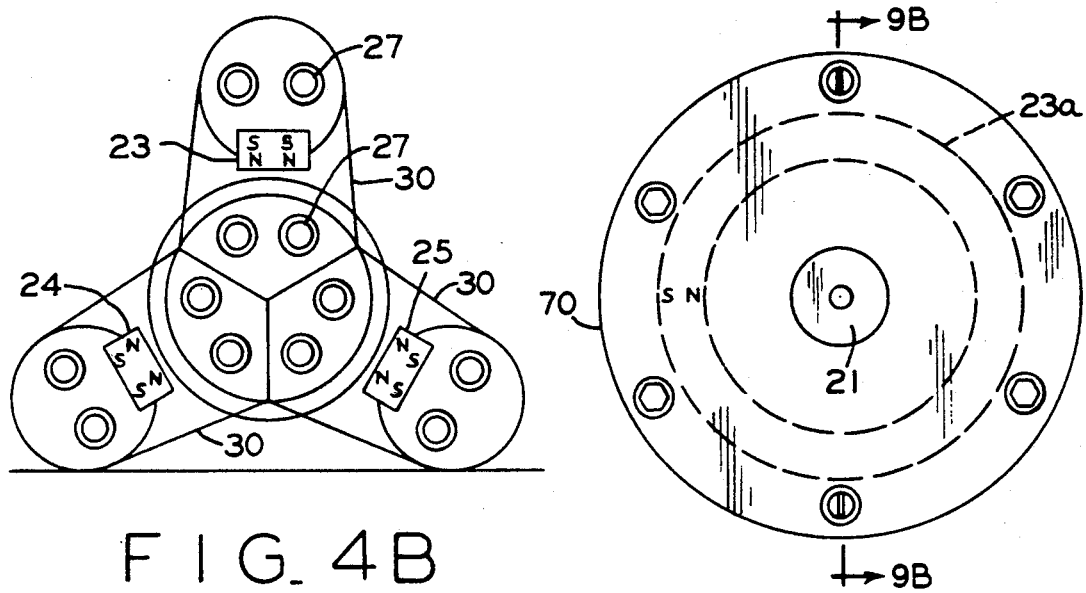
FIG. 4B
FIG. 9A
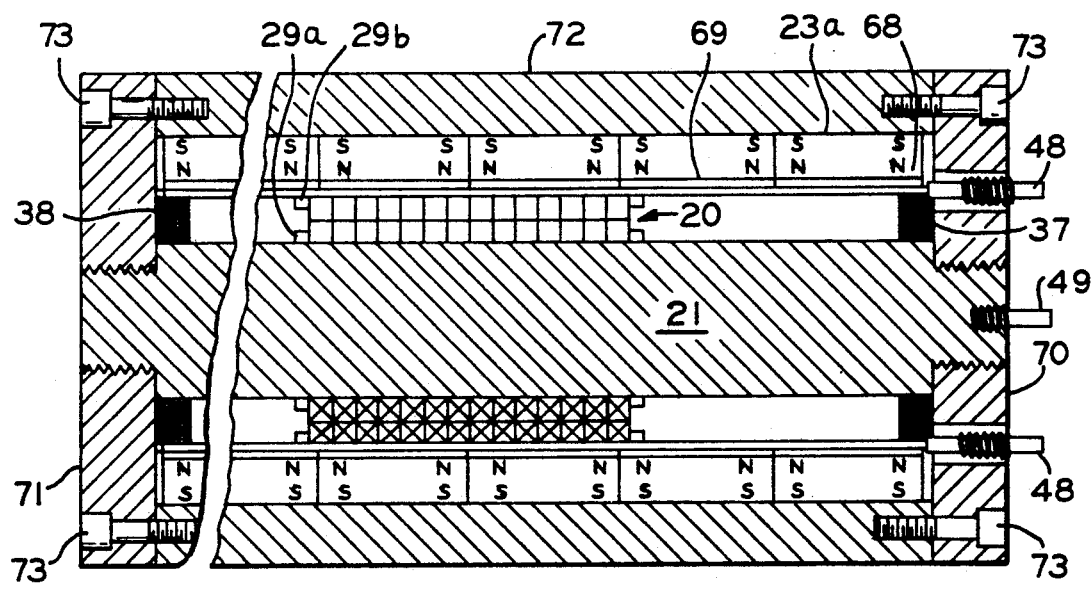
FIG. 9B

LINEAR ACTUATOR CONTROL SYSTEM FOR PLATFORM STABILIZATION

BACKGROUND OF THE INVENTION

The present invention relates to devices for stabilizing platforms on which precision processes are conducted. Specifically, a linear actuator in a feedback control system is described which will cancel disturbances added to the platform by operations carried out on the platform, as well as disturbances induced on the platform from external sources.

A motion stabilized platform is necessary to conduct different types of processes. For example, precision lithography is conducted on isolated platforms so that precision resolution may be obtained. In microlithography, used in the semiconductor fabrication art, the X-ray lithography technique is capable of defining features down to 0.25 micron lengths. These processes are carried out on a platform which is usually isolated from external vibrations and influences via air bearings to preserve the resolution of circuit elements created from a mask exposed to X-rays for defining the contours of an integrated circuit.

The growing of semiconductor substrate wafers in space is another area where a stabilized platform could be used. A large size and flawless quality of the wafer requires a vibration-free environment during the crystal growing process.

Other applications for a stabilized platform can include a medical operating table. To control the precise nature of surgical incisions and other procedures, the extraneous motion imparted to the operating table-platform must be minimal. Further, there is an interest in developing isolated platforms for conducting microgravity material processing experiments in space. It is contemplated that in the future, space shuttle missions will conduct such experiments on a floating platform.

Although techniques are available for isolating a platform from external disturbances and vibrations present in the environment (such as air bearing supports), the processes carried out on the isolated platform are themselves a source of self-induced platform forces. Any mechanical motion which takes place on an isolated platform will induce vibration to the platform, thus reducing the precision with which such processes are carried out. Further, the very process of supporting the platform, such as through air bearings, can induce vibrations in the platform. The platforms generally include some tethering i.e., external connections to the platform which, in a tensioned condition, tend to induce vibrations in the platform.

These precision processes in general require that there be stabilization of the platform such that residual vibration has a spectral density below $$10^{-12} \frac{G^2}{Hz},$$

up to a 10 Hz bandwidth. After a 10 Hz bandwidth, the vibration spectral density is permitted to increase at a 40 dB/Decade rate, without any significant deterioration in the processes being carried out on the isolated platform. This level of precision requires that the platform include some type of stabilization system which opposes these induced vibration forces.

One way of effecting stabilization of a platform is illustrated in U.S. Pat. No. 4,897,582. This system employs a linear actuator which is commutated to produce forces for opposing forces induced on the platform surface. The system actuator requires a commutator and complex switching circuits to produce the damping forces on the platform. The present invention is directed to these types of stabilization systems.

SUMMARY OF THE INVENTION

It is a principal object of this invention to provide an apparatus for stabilizing an isolated platform.

It is a more specific object of this invention to provide a linear actuator in a control loop which will generate a force cancelling self-induced platform forces.

These and other objects of the invention are provided by a linear actuator supported on a platform for stabilization. The linear actuator, in accordance with the preferred embodiment, includes a movable coil mounted for movement along the axis of an actuator guide parallel to one dimension of the platform. A plurality of rows of permanent magnets are spaced along a common radius coaxial with the movable coil axis.

An accelerometer of high sensitivity is coupled to the platform for providing a feedback signal representing the forces being experienced by the platform. A servo control system provides an energizing current to the movable coil in response to detected accelerations on the platform. The current generates a force between the movable coil and the stationary rows of magnets in a direction and magnitude for cancelling the detected acceleration forces on the platform.

In accordance with the preferred embodiment of the invention, the movable coil is supported over a cylindrical actuator guide for movement along one axis parallel to the plane of the platform. The movable coil is supported by a coil form which includes air plenums for receiving compressed air. Each air plenum, located at each end of the coil form, includes a plurality of holes which form an air bearing with the actuator guide. The air bearing reduces friction and stiction, permitting the generation of a minimum threshold force for cancelling the milli-Newton force associated with the detected disturbances.

The preferred embodiment of the invention also includes a low frequency caging loop associated with the actuator for maintaining the movable coil at the midpoint of the actuator guide. A pair of stationary windings is provided at each end of the actuator guide. The stationary windings are connected in a differential configuration. The movable coil, when energized with a high frequency signal, will induce the same levels of high frequency signals in each of the stationary winding when it is positioned at the midpoint of the guide. Thus, by detecting the voltage through the differentially connected stationary windings, it is possible to provide a signal for repositioning the movable coil to the midpoint of the actuator guide.

DESCRIPTION OF THE FIGURES

FIG. 4B is an end view showing the relationship between linear actuator guide and the rows of magnets used in the linear actuator 12.

FIG. 9A is an end view of a second embodiment of the invention equipped with brushes.

FIG. 9B is a section of the second embodiment having brushes for supplying current to the moving coil.

DESCRIPTION OF THE PREFERRED EMBODIMENT

Figure 1:
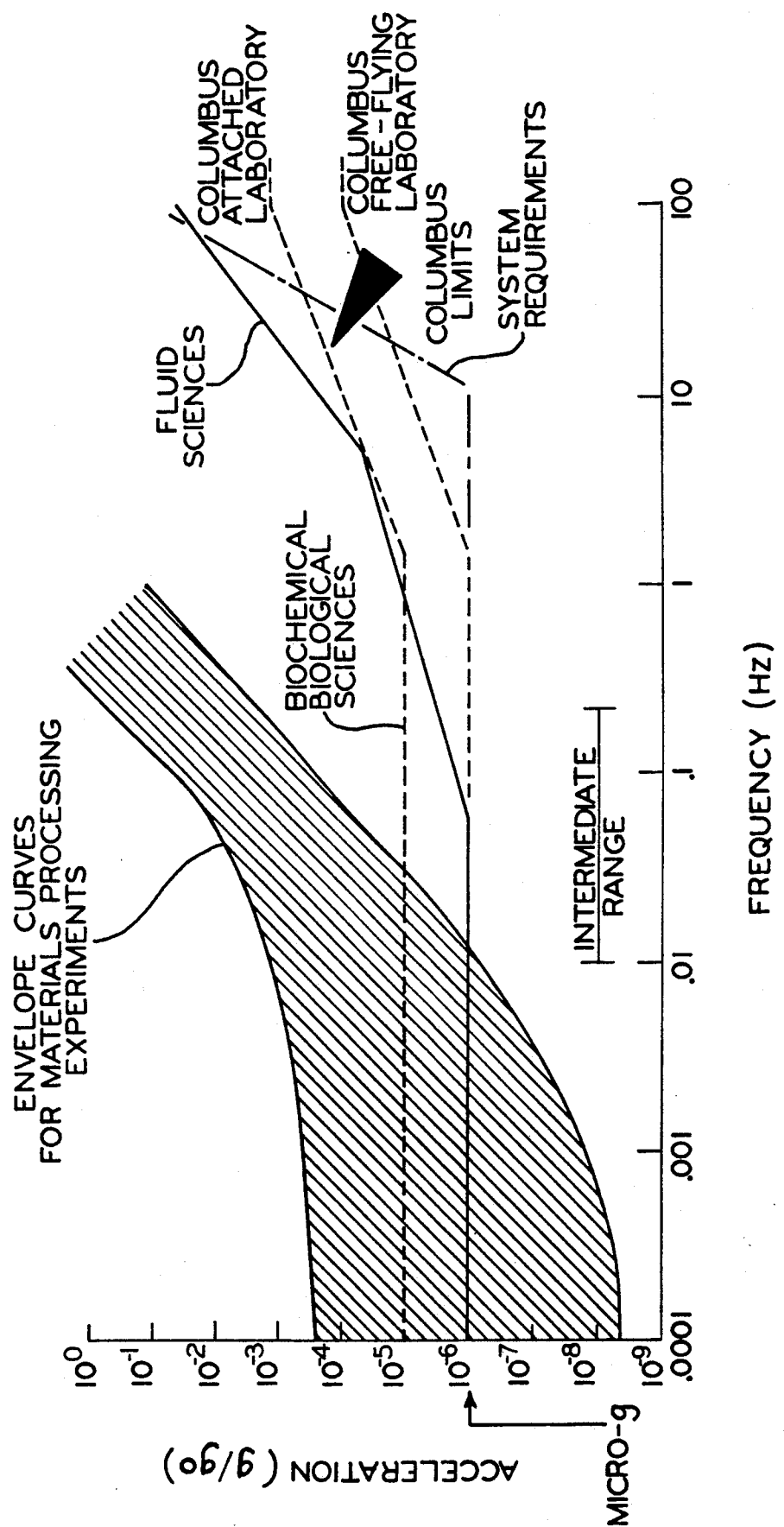
FIG. 1 illustrates the accelerations experienced by platforms used in various processes.

FIG. 1 is a graph demonstrating the requirements for platform stabilization for various applications in which processes are to be carried out on a motion stabilized platform. The graph represents the residual motion power spectral density for such applications as material processing experiments, biochemical/biological science applications, fluid sciences, and other related applications. The ordinate of the graph represents the acceleration on the platform as a fraction of a G. Thus, the indication $10^0$ refers to 1 G; $10^{-1}$, 1/10th of a G, and, $10^{-6}$ is a micro-G.

In establishing appropriate design goals for stabilizing a platform for many applications, the graph illustrates as a design goal a desired residual motion power spectral density floor. In the region below 10 Hz, an acceleration force of $10^{-6}$ micro Gs is deemed acceptable, and for those frequencies above 10 Hz, the tolerable acceleration in a given direction follows a slope of approximately 40 dB per decade of frequency.

Figure 2:
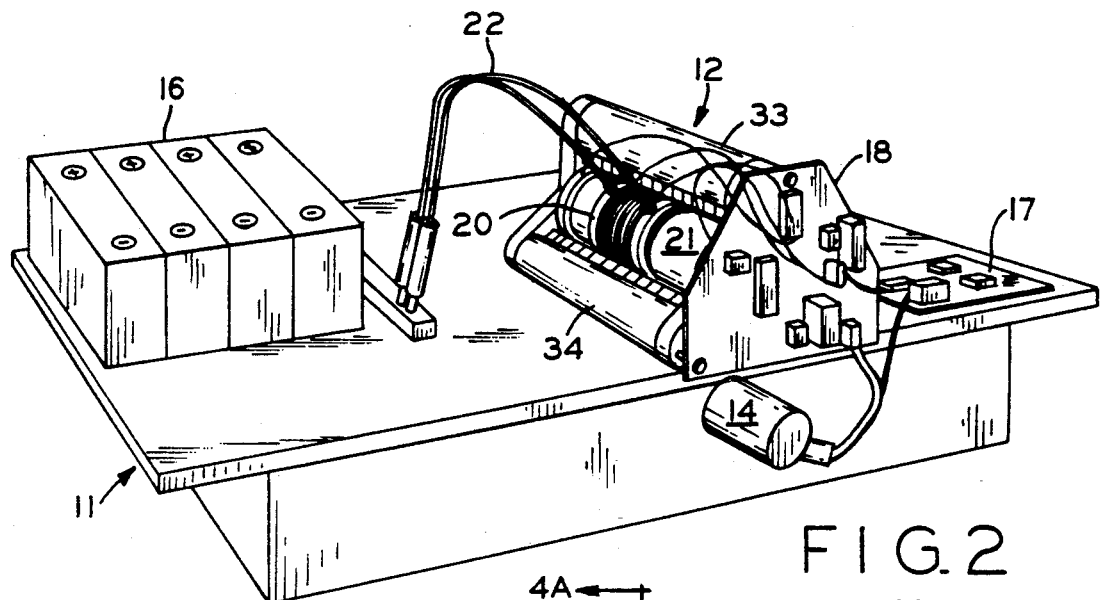
FIG. 2 shows the actuator and control circuitry used to stabilize a platform in one direction of movement.

With the foregoing system constraints in mind, a platform stabilized in one direction is illustrated in FIG. 2. The system of FIG. 2 can be implemented for two other coordinate directions, such as to provide three dimensions for stabilization of the platform 11 of FIG. 2 if necessary. In practice, the majority of destabilizing force influences may in fact only be in first and second directions in the plane of the platform, rendering stabilization in a third direction unnecessary.

Stabilized platform 11 of FIG. 2 includes an actuator 12 which imparts a force to the platform in a direction to cancel any forces which are detected to be in the direction X, parallel to the plane defined by the platform 11. The platform 11 is supported on an air cushion with suitable air bearings to minimize any vibration to the platform induced from external sources, such as machinery operating in the vicinity of the platform. The platform 11 includes an accelerometer 14 for detecting forces in the direction X applied to the platform 11. A plurality of batteries 16 on the platform 11 provide power to the actuator 12, accelerometer 14, control electronics 17 and drive electronics 18.

The actuator 12 is a linear actuator having a movable coil 20 which slides over an actuator guide 21. Forces applied to the surface of the platform 11 are cancelled by virtue of the force generated between the movable coil 20 and stationary portion of the actuator 12 which is rigidly fastened to the platform 11. Thus, under control of the control electronics 17, an electric current is applied from drive electronics 18 to the winding 29 of the movable coil 20 in order to generate a force for cancelling the disturbance force applied to the surface of the platform 11.

Also shown in FIG. 2 is a pair of air conduits 22 which supply air to the movable coil 20. The movable coil 20 includes a winding 29 wound about a coil form 28 which includes a pair of air plenums 35, 36 on each side thereof. The air plenums 35, 36 have holes facing the surface of the actuator guide 21 to reduce any friction or drag on the movable coil 20 which moves in response to the applied electric current.

A plurality of rows of magnets 23, 24, 25 (see FIGS. 3 and 4B) are spaced about a common radius and are parallel to the actuator guide. The movable coil 20 is free to move between the rows of magnets 23, 24, 25 and the actuator guide 21.

The inertial actuator 12 is an electromechanical device having a movable coil 20 supported on a center spindle 21 serving as the actuator guide. The force produced along the cylindrical axis of the movable coil 20 is proportional to the electric current through the coil winding 29, $i_\phi$ and the magnetic flux Br produced from the rows of magnets 23, 24, 25, this force being represented as $$F_z = Ni_\phi l_e B_r [\text{Newtons}]$$

where N is the number of turns, $B_r$ is the radial field magnetic flux density produced from the rows of magnets, $i_\phi$ is the current in the coil windings, and $l_e$ is the effective length of a turn of wire which is in the radial magnetic field. The force produced by the actuator is based on Newton's third law, that for every action there is an equal and opposite reaction, and provides stabilization of the platform.

The actuator can be shown to have an inertial force F versus input current I function more particularly in accordance with the following LaPlace transform:

$$\frac{F(s)}{I(s)} = \frac{KS^2 + \left[\frac{KR}{L}\right]S}{S^2 + \left[\frac{R}{L} + \frac{f}{M}\right]S + \left[\frac{Rf}{LM}\right]}$$

where L is the coil inductance;
R is the coil resistance;
f is the coil friction coefficient;
M is the coil mass; and
K is the force constant.

By reducing the static and dynamic coefficient of friction between the movable coil 20 and actuator guide 21, the performance of the actuator is significantly improved. Thus, the air bearing shown in the preferred embodiment assists in reducing the static and dynamic coefficients of friction. Alternatively, this parameter can be reduced using a low friction material on the inside diameter of the coil form, i.e., such as Teflon, and also by polishing the spindle. Powdered graphite between the stationary actuator guide surface 21 and moving coil surface will also reduce the coefficient of friction.

The structure shown in FIG. 2 provides for a minimal amount of tethering of the platform to the external environment, thus additionally isolating the platform 11 from external vibratory forces. By maintaining all the components of the actuator on the table, the tethering obstacle is removed.

Figure 3:
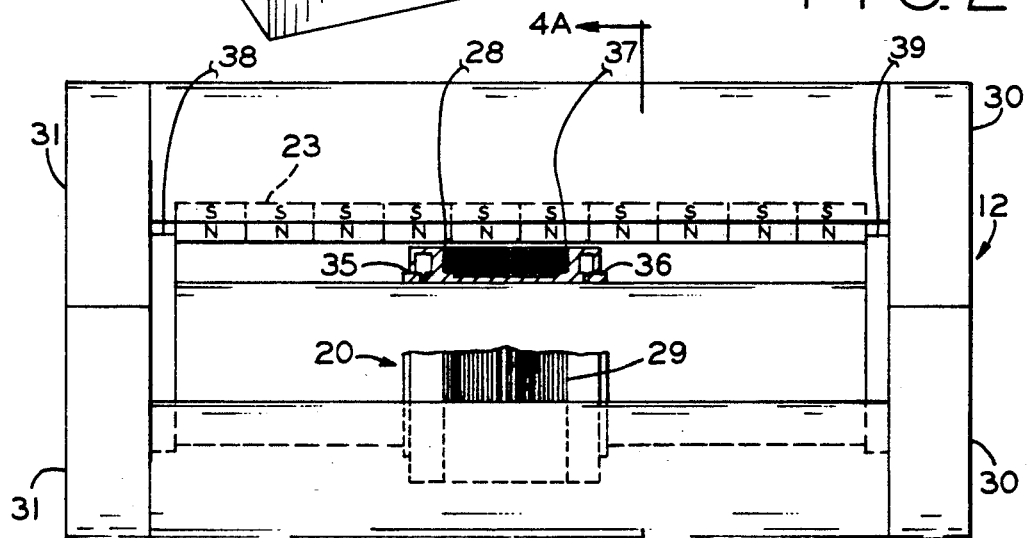
FIG. 3 is a section view of the linear actuator 12 used in the embodiment of FIG. 1.
Figure 4A:
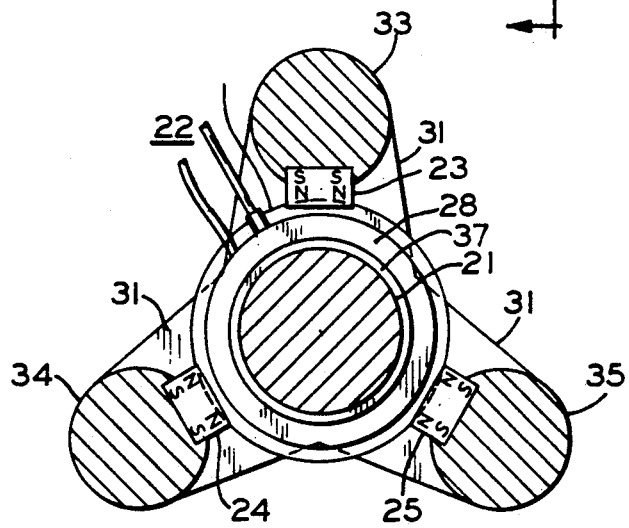
FIG. 4A is an end section view of the linear actuator 12 of FIG. 2.

Referring now to FIGS. 3 and 4A, there are shown two views of the actuator 12. The actuator 12 is supported at each end by end pieces 30, 31. The end pieces 30, 31 are held to the platform 11 so that any force developed between the movable coil 20 and the actuator guide 21 is imparted to the surface of the platform 11. The actuator 12 includes three rows of magnets 23, 24 and 25, each row comprising a linear array of permanent magnets spaced about a common radius from the center of the actuator guide 21. Each of the rows of magnets 23, 24 and 25 are held on this common radius by three magnet support assemblies 33, 34 and 35. End pieces 30 and 31 are fastened to the actuator guide 21 and magnet assemblies 33, 34 and 35, as shown in FIG. 4B using conventional threaded fasteners 27, and maintain the magnet support assemblies 33, 34 and 35 positioned with respect the radius of the actuator guide 21 so that the rows of magnets lie along a common radius.

The coil form 28 includes a pair of plenums 35 and 36, receiving air from the pair of air lines 21. The air through the plenums exits a series of apertures on the inside diameter of the coil form 28, thus forming in the space 37 between the actuator guide 21 and inner diameter of the coil form 28, an air bearing for the movable coil 20.

The windings 29 on the movable coil 20 are connected to the drive electronics 18 for receiving a current for developing the requisite force $F_z$ between the movable coil windings 29 and the stationary portion of the actuator 12, including the actuator guide 21, and front and rear end pieces 30 and 31.

The actuator guide 21 magnet supports 33, 34, 35 and end pieces 30, 31 may be made from a magnetic alloy such as vanadium permendur, which exhibits a high saturation flux density (greater than 23,000 gauss). Each of the magnets in the rows of magnets 23, 24 and 25 are permanent magnets which may be NdFeB (Neodymium-Iron-Boron) type 32 megaoersted Energy Product and are aligned end-to-end along each of the magnet supports 33, 34 and 35. The center spindle constituting the actuator guide 21 is also made from the magnetic alloy vanadium permendur.

Positioned at each end of the actuator guide 21 are first and second position sensing coils 38 and 39. These position sensing coils permit a caging signal to be developed, indicating the relative position of the movable coil 20 with respect to each end of the sensing coils 38 and 39. This position sensing arrangement will permit the coil 20 to be positioned at the midpoint of the actuator guide 21 to preserve the stroke of the movable coil along the actuator guide 21.

Figure 5:
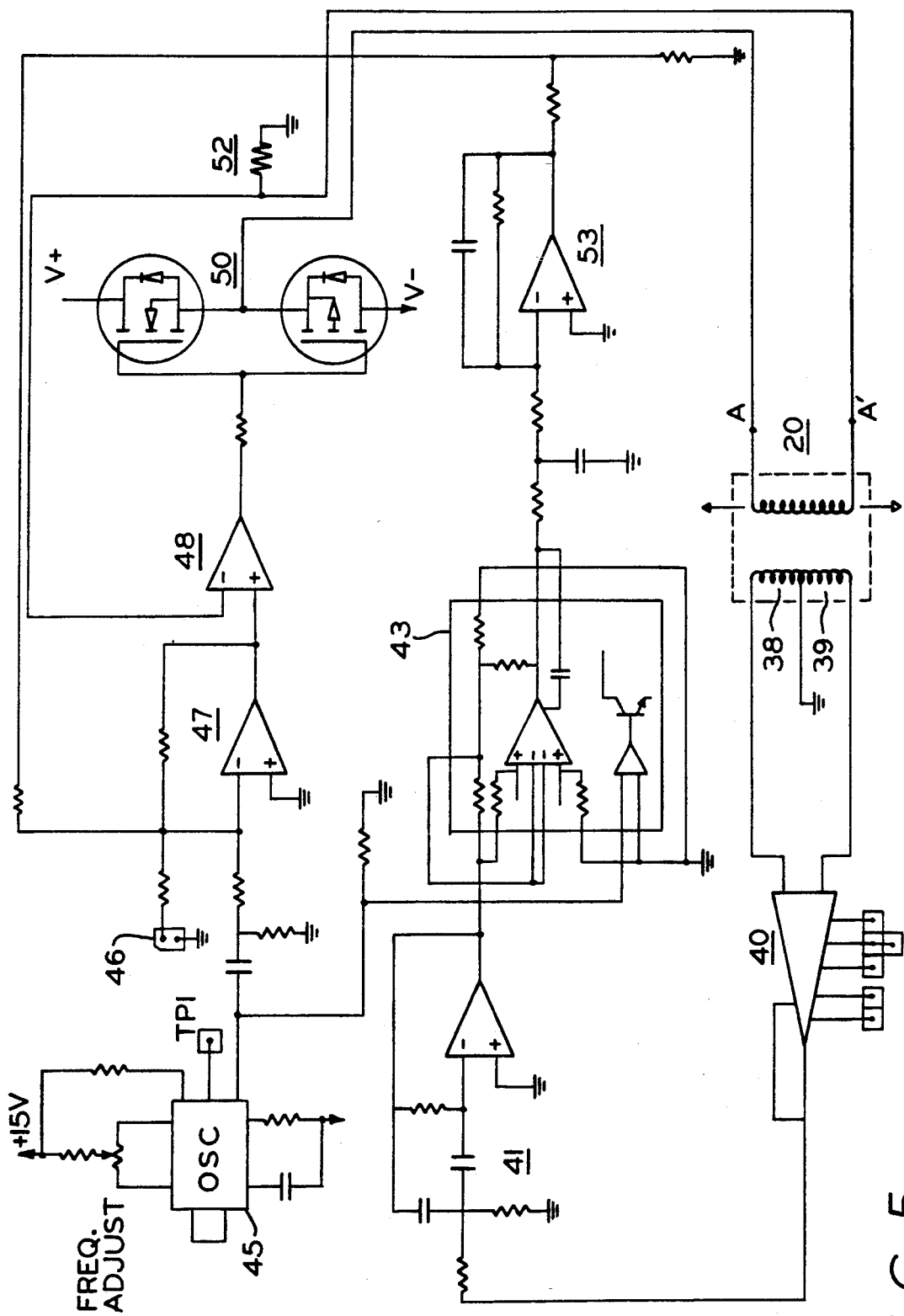
FIG. 5 illustrates the drive and caging electronics 18 used to produce the current for the movable coil of the linear actuator.

Referring to FIG. 5, there is a schematic drawing of the actuator drive electronics 18 which generate the actuating current the movable coil 20, producing the required force between the movable coil 20 and stationary elements of the actuator 12. These electronics also process the differential voltage from the sense coils to provide the caging (position nulling) control.

The drive electronics of FIG. 5 include a first oscillator circuit 45 for generating a high frequency 10 kHz sine wave signal used to detect the position of the movable coil 20. The sine wave signal is applied to the movable coil 20 through the summing amplifier 47, and feedback amplifier 48. Summing amplifier 47 receives a feedback control signal from the control electronics 17 through the V drive input 46. The position signal derived from the caging circuitry, including the active low pass filter 53, is also summed with the drive signal in summing amplifier 47 to slowly bring the coil back to the midpoint or null position.

A pair of power MOSFET driving circuits 50 are shown for supplying a driving current to the movable coil 20. The 10 kHz sine wave signal portion of this drive signal is also magnetically coupled via the actuator guide 21 to the left and right sensing coils 38 and 39. As shown in FIG. 5, the sensing coils are connected in a differential configuration such that the resulting differential voltage between coils 38 and 39 represents the relative position of the moving coil 20 with respect to each of the stationary left and right position sensing coils 38 and 39.

The signal produced from the differential connection of the position sensing coils 38 and 39 is supplied to amplifier stage 40. The signal from amplifier stage 40 is amplified again with a second amplification stage 41.

The demodulator 43 configured as a lock-in amplifier receives the detected differential voltage signal from the stationary left and right position sensing coils 38 and 39, as well as a reference signal from the oscillator 45. The resulting output signal is effectively the rectification of the differential voltage between the sense coils 38 and 39.

The demodulator output signal from demodulator 43 is applied to an active low pass filter 53 and produces a bias voltage $V_{cage}$ for maintaining the coil position 20 centrally located along the actuator guide 21.

Thus, in the absence of a drive signal 46, there is a potential applied to the coil 20 for returning it to the central location along the actuator guide 21. There is additionally a feedback component from the movable coil winding 20 produced by the resistor 52. This feedback potential is applied to the differential amplifier 48, thus providing precise control of the drive current through the movable coil 20 in high force, high damping conditions.

Figure 6:
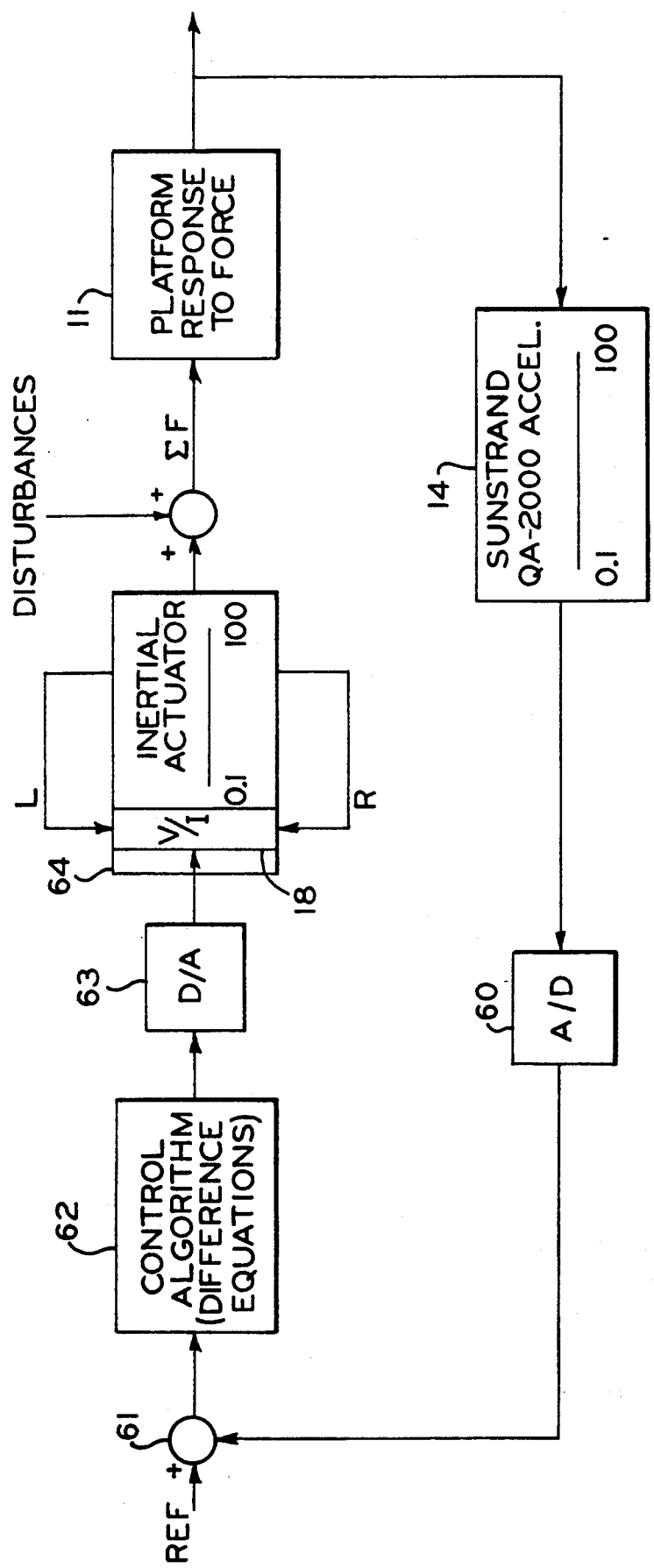
FIG. 6 illustrates the servo control system for damping forced disturbances in one dimension of a platform.

It can be seen that by applying a potential to the $V_{drive}$ input 46, a current is produced across terminals AA' for energizing the movable coil 20. As will be clear from a description of the electronic controller 17, this potential may be derived by sensing forces induced on the platform 11. The drive voltage will therefore produce a current which generates the requisite force for damping the sensed platform Referring now to FIG. 6, there is shown a block diagram of the electronic controller 17 used to provide a signal from the accelerometer 14 mounted on the platform 11 to the drive electronics 18. As indicated in FIG. 6, the control system is essentially a digital control system which receives the analog acceleration signal resulting from platform forces from the Sundstrand QA-2000 accelerometer 14. An analog-to-digital converter 60 provides a digital signal to a differential node 61. A reference level is also applied to the differential node 61.

The digital signal processor 62, which can be a Motorola type 56000 digital controller, will process the feedback signal from the accelerometer 14 in accordance with a control algorithm. The resulting actuating signal is applied to the digital-to-analog converter 63, which produces an analog voltage representing $V_{drive}$ 46 of the drive electronics 18.

Shown also in FIG. 6 is a low pass filter 64. Low pass filter 64 is inserted to reduce the amount of high frequency noise resulting in local disturbances on the table for which compensation is not desired. Local resonances, exceeding 1,000 Hz. are generally not to be compensated by the system and they are filted via the filter 64. The filter 64 may have the transfer function as follows:

$$\left[ \frac{W_h^2}{S^2 + 2\delta W_h S + W_h^2} \right]$$

where $\delta$ = damping coefficient of analog low pass filter and $W_h$ = resonant frequency of low pass filter ($2\pi f_H$).

The inertial actuator will generator a force proportional to the digital value produced by the control algorithm 62. The force is applied in opposition to disturbances on the platform, giving a net force $\Sigma F$ to the platform which is the difference between the disturbance force measured by the accelerometer 14 and the inertial actuator force which is applied in opposition to the disturbance forces.

The control algorithm 62 for processing the feedback signal from the accelerometer 14 is derived in the preferred embodiment from an 8th order low pass filter, designed for minimal phase loss. The algorithm takes the form of the following:

$$C(s) = \left[ K_1 \frac{(S + W_1)(S + W_2)}{(S + W_3)(S + W_4)} \right]^2 \left[ K_2 \frac{(S + W_5)(S + W_6)}{(S + W_7)(S + W_8)} \right]^2$$

This algorithm, represented in the LaPlace format, includes four zeroes, four poles and two constants as follows:

$W_1 = 2\pi (500)$    $W_5 = 2\pi (2000)$
$W_2 = 2\pi (800)$    $W_6 = 2\pi (2500)$    $K_1 = \frac{W_3 W_4}{W_1 W_2}$
$W_3 = 2\pi (150)$    $W_7 = 2\pi (600)$
$W_4 = 2\pi (1000)$   $W_8 = 2\pi (3000)$    $K_2 = \frac{W_7 W_8}{W_5 W_6}$ The algorithm may be implemented in the aforesaid Motorola 56000 signal processor as four second order blocks. These blocks may be translated to difference equations for processing the signal to derive the required algorithm.

Figure 7:
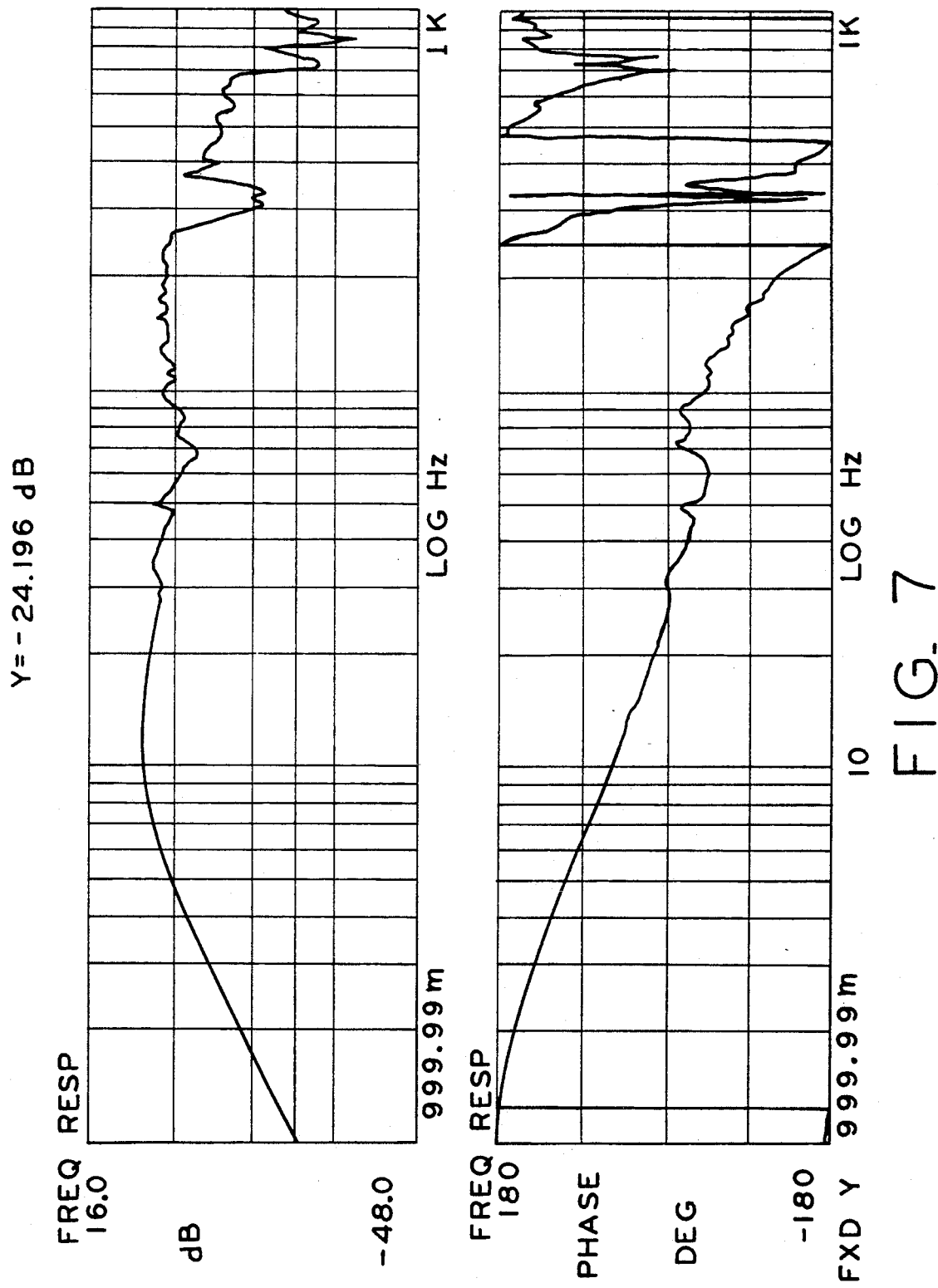
FIG. 7 illustrates the amplitude and phase response of the open loop control system of FIG. 6.

Referring now to FIG. 7, there is shown the open-loop response of the system of FIG. 6, wherein only a reference signal is used, and the feedback signal to the differential node 61 is interrupted. As can be seen from FIG. 7, the amplitude and phase response of the uncompensated system are shown.

Figure 8:
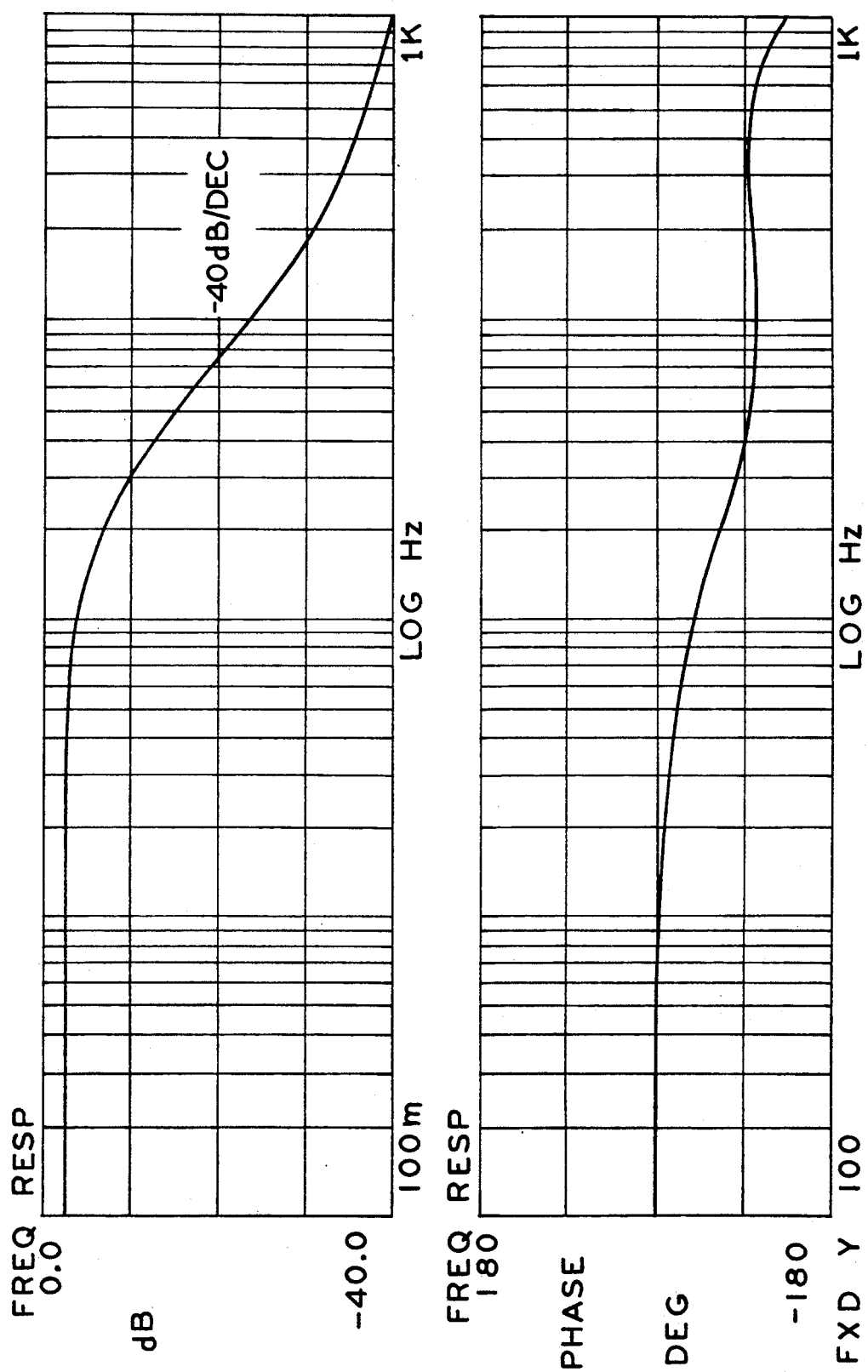
FIG. 8 illustrates the amplitude and phase response for the closed loop control system of FIG. 6.

FIG. 7 is in distinct contrast from the closed loop response of FIG. 8, wherein an essentially flat amplitude response is obtained to 10 Hz, at which time the amplitude response decreases at approximately 40 dB/decade. The accompanying phase response also shows the system stability up to 1,000 Hz of operation, illustrating a very stable system.

The inertial actuator is itself designed to have a bandwidth of effectively 10 times the closed loop control bandwidth. FIG. 7 illustrates the open loop response of the system wherein up to 1,000 Hz may be obtained. On the other hand, the response of the closed loop of FIG. 8 shows how control may be effected upwards to 80–100 Hz.

The improved platform response to force from the closed loop system is the desired effect for reducing force disturbances added to the platform 11. The damping realized from the aforesaid algorithm results in a stable system, meeting the design objectives illustrated in FIG. 1.

A second embodiment of the invention is illustrated in FIGS. 9A and 9B. In this cylindrical configuration of the inertial linear actuator, a pair of brushes is formed comprising a cylindrical tube 68 insulated from an array of magnets 23a by a cylindrical insulator 69 and the actuator guide 21. The brushes 29a, 29b connected to the ends of coil winding 29 contact the outer conductor 68 and the conductive actuator guide 21. The magnets 23a are toroidal in shape, having generally a south pole at the outer circumference thereof, and a north pole on the inner circumference thereof. The cylindrical magnets are positioned to direct a radial field into the movable coil 20. By using magnets which are toroidal, the resultant magnetic B field is increased over the previous embodiment. As will be appreciated from reference to FIGS. 2 and 3 of the previous embodiment, the available flux for generating a force is limited along the three axes of the linear arrays of magnets. A pair of end pieces 70, 71 are suitably fastened to the actuator guide 21 and the outer cylindrical housing 72 with fasteners 73.

The embodiments of FIGS. 9A and 9B provide for the greater magnetic flux field, and hence greater force generation for the movable coil 20. However, this advantage comes at an expense in terms of actuator stroke length. The magnetic field from the toroidal magnets 23a passes through the movable coil 20 into the actuator guide 21, also of a magnetic material such as Permendur. The flux from each of the magnets 23a tends to increase at the ends of the actuator guide 21, where all the flux from all the magnets concentrates to complete the magnetic circuit. The high flux concentration at the actuator guide ends will reduce the stroke of the embodiment of FIGS. 9A and 9B.

In high force applications, however, where a long stroke may not be needed, the cylindrical arrangement of FIGS. 9A and 9B offer the advantage of a much increased force generation per actuator current level.

The previous embodiments of FIGS. 2 and 3, having less force, permit the cancellation of very low levels of force in the micro-G range. By controlling the stiction to be less than 0.1 milli-Newton, using the air bearing structure of the previous embodiment, it is possible to cancel the micro-G forces. The second embodiment having the associated brush structure would increase the stiction/friction, and therefore not have the advantages of the previous low friction/stiction embodiment of FIGS. 2 and 3.

Thus, there has been described a system for stabilizing a platform with a non-tethered actuator system. Vibration disturbances acting on the platform can be significantly reduced as a result of the closed loop sensing, wherein detected disturbances are used to develop a correcting force by the inertial actuator.

What is claimed is:

1. An inertial actuator stabilizing system for stabilizing a platform against vibration comprising:
    an actuator guide supported on said platform by first and second end pieces;
    first, second and third rows of permanent magnets supported by said end pieces, about an axis of said actuator guide, and parallel to said actuator parallel to said axis and spaced therefrom;
    a movable coil having windings coaxial with said actuator guide which slides over said actuator guide between said rows of magnets in response to a current flowing through said coil windings;

an accelerometer coupled to said platform for sensing acceleration forces applied to said platform; and, electronic means connected to said accelerometer for producing a current for said movable coil windings which generates a force on said movable coil having a direction opposite to said sensed acceleration forces.

2. The inertial actuator stabilizing system of claim 1 further comprising first and second position sensing windings located on opposite ends of said actuator guide, said position sensing windings supplying a current to said electronic means which produces a biasing current positioning said movable coil along said actuator guide.

3. The inertial actuator of claim 1 wherein said movable coil is disposed on a coil form which comprises an annular air plenum which connected to a source of air, and which discharges said air through a plurality of apertures facing said actuator guide, thereby forming an air bearing with said actuator guide.

4. The inertial actuator of claim 2 wherein said first and second position sensing windings are magnetically coupled with said movable coil, and differentially connected to provide a voltage having a magnitude and polarity which forces said movable coil to a central position along said actuator guide.

5. The inertial actuator of claim 2 further comprising a source of alternating current signal connected to said electronic means for providing a caging signal to said movable coil which is induced in said first and second position sensing windings.

6. The inertial actuator of claim 1 wherein said electronic means provides a low pass filter function for said accelerometer signal, having an 8th order filter function.

7. In a system for stabilizing a platform against acceleration forces applied to said platform, an inertial actuator comprising:

an actuator guide supported on said platform by first and second end pieces;

a plurality of rows of permanent magnets parallel to said actuator guide, and spaced apart therefrom along a common radius;

a movable coil having a plurality of windings coaxial to said actuator guide inside said common radius, said coil being freely slidable over said actuator guide in response to an electric current applied thereto; and, first and second position sensing coils on each end of said actuator guide, said sensing coils being connected together to provide a differential voltage having a polarity and magnitude proportional to the position of said movable coil.

8. The inertial actuator of claim 7 wherein said movable coil comprises:

an air plenum surrounding said actuator guide having an air inlet and a plurality of outlets facing said actuator guide, forming an air bearing with said actuator guide; and, a multi-turn winding wound about the exterior surface of said air plenum, having first and second ends adapted to receive said electric current.

9. The inertial actuator of claim 7 wherein said movable coil comprises:

a coil form surrounding said actuator guide, forming a sliding bearing with said actuator guide; and, a multi-turn winding surrounding said coil form, having first and second ends for receiving said current.

10. The inertial actuator of claim 7 wherein said first and second position sensing coils are magnetically coupled with said movable coil by said actuator guide.

11. The inertial actuator of claim 7 wherein each row of magnets comprises a linear array of a plurality of magnets parallel to the axis of said actuator guide.

12. An inertial actuator for generating a linear force comprising:

a cylindrical support having an axis aligned in a direction of a force to be generated;

a cylindrical coil form supported for sliding contact with said cylindrical support, said coil form including a coil winding having first and second ends, said first end in electrical contact with said cylindrical support;

a cylindrical brush coaxial with said support and coil form, having an inner surface in sliding contact with said coil winding second end;

a toroidal permanent magnet means having an axis coaxial with said cylindrical support, directing a magnetic flux through said coil; and, a cylindrical housing enclosing said cylindrical support, coil form and toroidal permanent magnet means, said housing being terminated at each end with first and second end pieces, forming a magnetic circuit with said cylindrical support and toroidal permanent magnet means.

13. An inertial actuator in accordance with claim 12 wherein said toroidal permanent magnet means comprises a plurality of toroidal magnets.

14. An inertial actuator in accordance with claim 12, further comprising position sensing means for determining the relative position of said cylindrical coil form and coil winding.

15. An inertial actuator in accordance with claim 14 wherein said position sensing means comprises first and second sensing windings at opposite ends of said cylindrical support differentially connected to provide a current proportional to the relative distance between said coil form and said ends of said cylindrical support.

* * * * *